(12) United States Patent
Rak et al.

(10) Patent No.: US 6,763,580 B2
(45) Date of Patent: Jul. 20, 2004

(54) METHOD AND APPARATUS FOR SECURING AN ELECTRICALLY CONDUCTIVE INTERCONNECT THROUGH A METALLIC SUBSTRATE

(75) Inventors: Stanton Rak, Evanston, IL (US); Ying Wang, Wheeling, IL (US)

(73) Assignee: Motorola, Inc., Schaumburg, IL (US)

( * ) Notice: Subject to any disclaimer, the term of this patent is extended or adjusted under 35 U.S.C. 154(b) by 5 days.

(21) Appl. No.: 10/103,084

(22) Filed: Mar. 21, 2002

(65) Prior Publication Data

US 2003/0178477 A1 Sep. 25, 2003

(51) Int. Cl.[7] .............................. H05K 3/34; H05K 3/00; H01L 23/02; H01L 23/52
(52) U.S. Cl. ...................... 29/843; 29/840; 228/180.1; 228/254; 361/760; 257/678; 257/734; 257/773
(58) Field of Search .............................. 228/254, 180.1, 228/208; 361/760, 761; 257/678, 734, 773; 29/840, 843

(56) References Cited

U.S. PATENT DOCUMENTS

| | | | |
|---|---|---|---|
| 4,082,394 A | 4/1978 | Gedney et al. | |
| 4,434,134 A | 2/1984 | Darrow et al. | |
| 4,598,470 A | 7/1986 | Dougherty, Jr. et al. | |
| 4,954,313 A | 9/1990 | Lynch | |
| 5,030,499 A | 7/1991 | Shaheen et al. | |
| 5,080,958 A | 1/1992 | Patterson et al. | |
| 5,101,322 A | 3/1992 | Ghaem et al. | |
| 5,123,164 A | 6/1992 | Shaheen et al. | |
| 5,170,245 A | 12/1992 | Kim et al. | |
| 5,216,581 A | 6/1993 | Fisher et al. | |
| 5,265,322 A | 11/1993 | Fisher et al. | |
| 5,316,787 A | 5/1994 | Frankeny et al. | |
| 5,435,480 A | 7/1995 | Hart et al. | |
| 5,468,988 A * | 11/1995 | Glatfelter et al. ........... 257/431 |
| 5,640,761 A | 6/1997 | DiStefano et al. | |
| 5,715,595 A | 2/1998 | Kman et al. | |
| 5,894,054 A | 4/1999 | Paruchuri et al. | |
| 6,037,539 A | 3/2000 | Kilgo et al. | |
| 6,114,098 A | 9/2000 | Appelt et al. | |
| 6,129,262 A | 10/2000 | Cooper et al. | |
| 6,199,273 B1 * | 3/2001 | Kubo et al. ................. 29/843 |
| 6,244,497 B1 | 6/2001 | Conn et al. | |
| 6,264,096 B1 | 7/2001 | Belt et al. | |
| 6,468,439 B1 * | 10/2002 | Whitehurst et al. ........... 216/95 |
| 2001/0026010 A1 * | 10/2001 | Horiuchi et al. ............ 257/678 |
| 2003/0076663 A1 * | 4/2003 | Hirano et al. ............... 361/760 |
| 2003/0127737 A1 * | 7/2003 | Takahashi ................... 257/738 |

FOREIGN PATENT DOCUMENTS

EP 0 411 551 A2 7/1990

OTHER PUBLICATIONS

Matijasevic, G. et al. "Multilayer Circuitry on Metal Substrates." www.electronics–cooling.com/html/2000_sep_techbrief.html.

Patel,. J. et al. "Microplasmic Coatings." *American Ceramic Society Bulletin*, vol. 80, No. 4, Apr. 2001, pp. 27–29.

* cited by examiner

Primary Examiner—L. Edmondson
(74) Attorney, Agent, or Firm—Brian M. Mancini; Thomas V. Miller

(57) ABSTRACT

A method and module for securing a conductive interconnect (30) through a metallic substrate (36). The method includes the steps of: forming a hole (34) in the metallic substrate (36), the hole (34) defined by an internal surface (46) of the metallic substrate (36); applying an electrically insulating layer (48) to the metallic substrate (36) including the internal surface (46); applying a solderable coating (50) to at least a portion of the electrically insulating layer (48) around the hole (34); applying a solder (52) to at least a portion of the solderable coating (50) at and above the hole (34); inserting the conductive interconnect (30) through the hole (34); and solder bonding the conductive interconnect (30) within the hole (34).

23 Claims, 4 Drawing Sheets

METHOD AND APPARATUS FOR SECURING AN ELECTRICALLY CONDUCTIVE INTERCONNECT THROUGH A METALLIC SUBSTRATE

CROSS-REFERENCE TO RELATED APPLICATION

This application is related to the following co-pending and commonly assigned patent application, which is hereby incorporated by reference herein: application Ser. No. 10/103,590 entitled "Method and Apparatus for Securing a Metallic Substrate to a Metallic Housing," filed on same date herewith, by Ying Wang and Thomas P. Gall.

FIELD OF THE INVENTION

This invention in general relates to electronic circuits mounted on metallic substrates and, more particularly, to a method and apparatus for securing an electrically conductive interconnect through the metallic substrate.

BACKGROUND OF THE INVENTION

Engine mounted electronic control modules for vehicular engines are subject to a high level of heat and vibration. In these applications, electronic components and circuits are formed on a metallic substrate that typically needs to be enclosed within a sealed metallic housing. In the past, it has been difficult and costly to electrically connect the internally enclosed electronic components and circuits to external devices.

Providing a through-hole to electrically connect circuits has been used on ceramic and fiberglass substrates or boards. However, these schemes do not address electronic devices that have thermally conductive metallic substrates such as aluminum. When using a metallic substrate and within a metallic housing, care must be taken so as to electrically insulate any components and connectors from the metallic substrate and housing.

For metallic substrates, prior methods have extended a plurality of pins through a single window opening in the metallic substrate. An insert-molded lead frame extends through the window opening and provides isolation between the plurality of pins. A series of wire bonds are then necessary to connect the pins to the electronic circuit on the metallic substrate. Moreover, a separate special plating process is typically required on the metallic substrate for the circuits and components. The use of wire bonds and plating process, however, increases the complexity of the manufacturing process and, accordingly, increases the cost of the module.

An interconnect within a through-hole has been used for steel substrates on voltage regulators. The through-hole in that application, however, is glass sealed and still requires the use of wire bonds to connect the interconnect to the circuit on the metallic substrate.

In sum, current devices and methods to connect electronic components and circuits through a metallic substrate are costly. Accordingly, there is a need for improved ways to provide an interconnect approach that reduces the complexity of the manufacturing process and reduces costs. This is especially important in high volume applications such as electronic control modules for vehicles. Moreover, new interconnect approaches should take advantage of lower cost metallic substrates such as aluminum.

It is, therefore, desirable to provide an improved device and method of securing an electrically conductive interconnect through a metallic substrate to overcome most, if not all, of the preceding problems.

Figure 1:
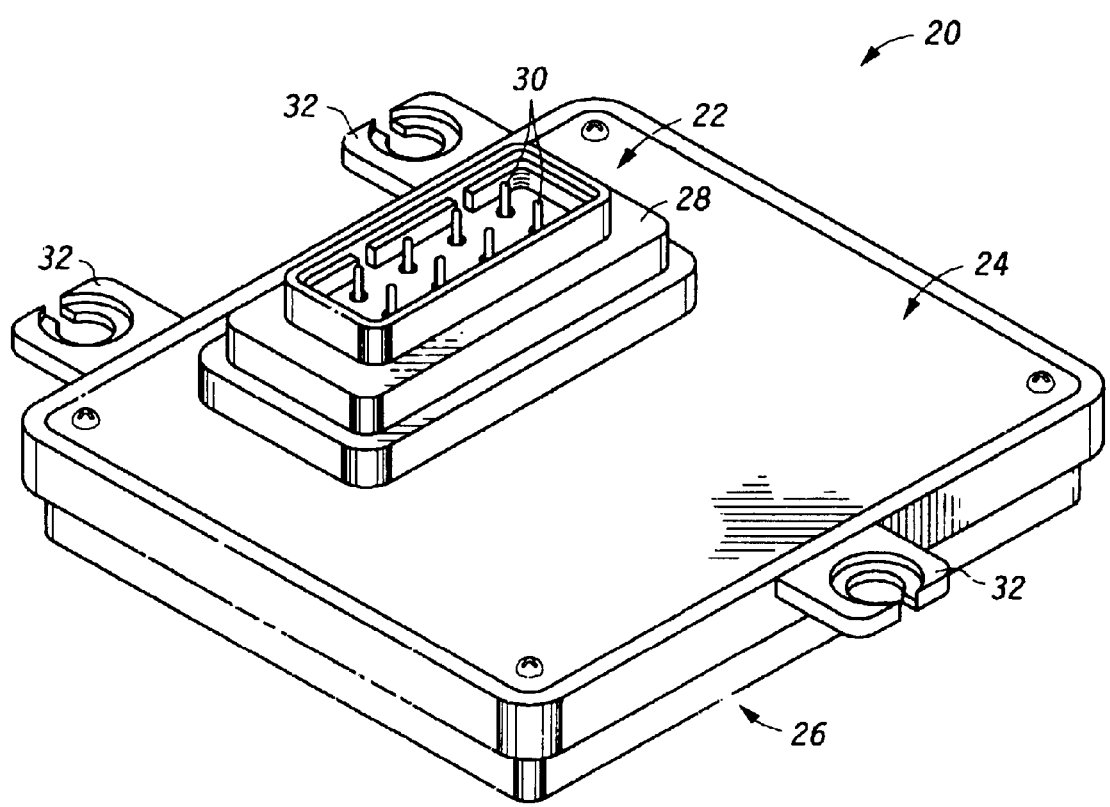
FIG. 1 is a perspective view of an electronic control module according to one embodiment of the present invention.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the appended claims.

DETAILED DESCRIPTION

What is described is a method and apparatus for securing an electrically conductive interconnect through a metallic substrate. For purposes of illustration, an example of the method and apparatus will be described in the context of an electronic control module for a vehicle. However, the present invention is not limited to modules for vehicles but may also apply to other housings or devices where electrically conductive interconnects are needed through a metallic substrate.

To this end, generally, in one embodiment there is a method for securing an electrically conductive interconnect through a metallic substrate having a first surface and a second surface. The method may include the steps of: forming a hole in the metallic substrate, the hole defined by an internal surface of the metallic substrate that extends from the first surface to the second surface of the metallic substrate; applying an electrically insulating layer to the metallic substrate including at least the first surface, the second surface, and the internal surface; applying a solderable coating to at least a portion of the electrically insulating layer on the second surface of the metallic substrate around the hole; applying a solder to at least a portion of the solderable coating at the hole; inserting the interconnect through the hole; and solder bonding the interconnect within the hole.

Another embodiment of the present invention includes a module having a connector and a metallic substrate. The connector has a connector housing and a plurality of electrically conductive interconnects. The metallic substrate has a plurality of holes, a first surface, a second surface, and an electrically insulating layer. The insulation layer is formed on at least the first surface, the second surface, and within the plurality of holes. Each interconnect then extends through a separate hole in the metallic substrate and is attached to the insulating layer of the metallic substrate by a solderable coating and a solder.

In a further embodiment, the present invention includes an electronic control module for a vehicle having a connector and a metallic substrate. The connector has a connector housing and a plurality of electrically conductive interconnects. The metallic substrate has a plurality of holes, a first surface, a second surface, and an electrically insulating layer. The insulating layer is formed on at least the first surface, the second surface, and within the plurality of holes. In this embodiment, the electronic control module also has a means for securing the plurality of interconnects to the metallic substrate to provide a hermetic seal. Additionally, the electronic control module has a means for electrically connecting the plurality of interconnects to components and circuitry on the metallic substrate without the use of wire bonds.

Now, turning to the drawings, an example use of a method and apparatus will be explained in the context of an electronic control module for a vehicle. FIG. 1 shows an electronic control module 20. In one embodiment, generally, the electronic control module 20 has a connector 22, a metallic substrate 24, and a module housing 26.

The connector 22 includes a connector housing 28 and a plurality of electrically conductive interconnects 30. The interconnects 30 may take a variety of forms but, in one embodiment, may be cylindrical metallic pins.

The substrate 24 is made of a metallic material. In one embodiment, the substrate 24 is made of aluminum. Aluminum is less expensive than other metallic materials and is a good conductor of heat that is important for automobile applications. The metallic substrate 24 is used for mounting the components and other circuitry for the electronic control module 20.

The module housing 26 may be made of a hard material such as aluminum. The module housing 26 is attached to the substrate 24 to define an internally sealed cavity to store the components and other circuitry for the electronic control module 20. For automobile uses, the module housing 26 may also have outwardly extending flanges 32 to mount the electronic control module 20 to an automobile (not shown).

Figure 2:
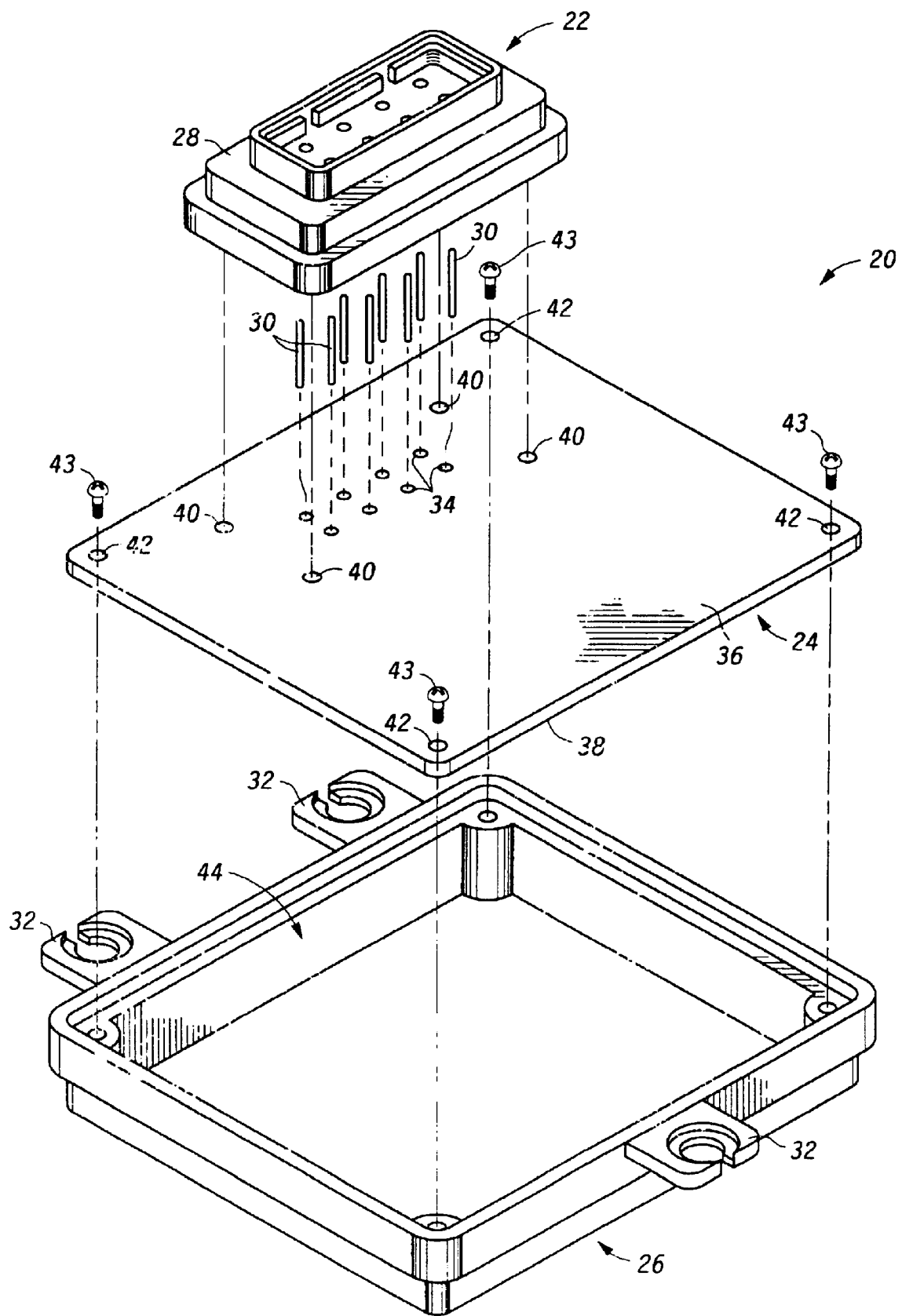
FIG. 2 is an exploded view of the electronic control module in FIG. 1.

FIG. 2 illustrates an exploded view of the electronic control module 20 shown in FIG. 1. In one embodiment, the metallic substrate 24 has a plurality of interconnect holes 34, a first surface 36, and a second surface 38. The metallic substrate 24 may further have holes 40 for connecting the connector housing 28 to the first surface 36 of the metallic substrate 24 by the use of mechanical fasteners such as screws 41 (shown in FIG. 3).

The metallic substrate 24 may further have other holes 42 for connecting metallic substrate 24 to the module housing 26 by the use of mechanical fasteners such as screws 43. A further method is described in more detail below for attaching the metallic substrate 24 to the module housing 26 to provide a hermetic seal. The metallic substrate 24 and the module housing 26 may then define a hermetically sealed internal cavity 44.

Figure 3:
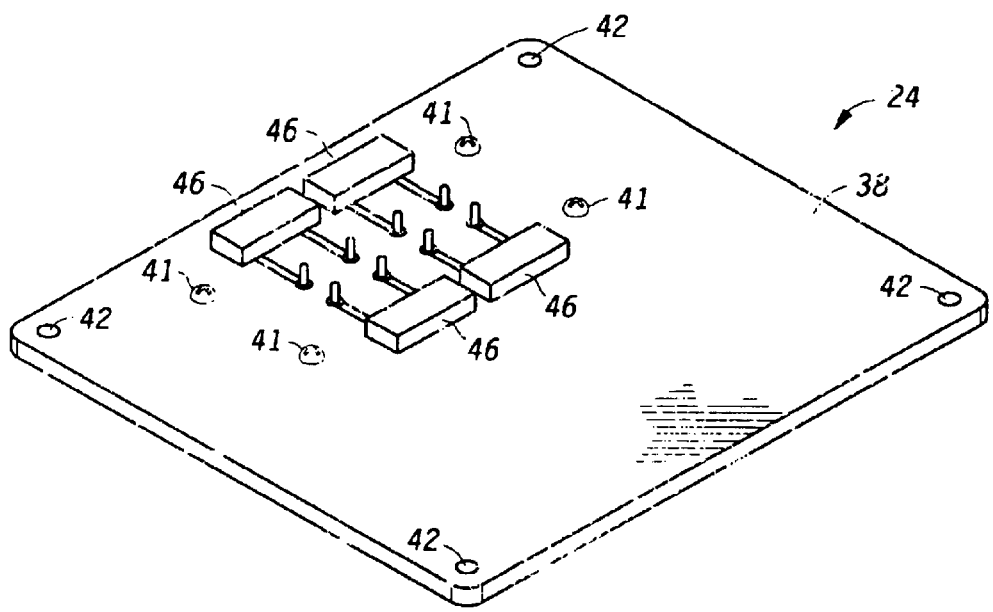
FIG. 3 is a perspective view of one metallic substrate of the present invention.

FIG. 3 illustrates a perspective view of the second surface 38 of the metallic substrate 24. The second surface 38 of the metallic substrate 24 is used for mounting components 46 and other circuitry of the electronic control module 20 within the sealed internal cavity 44. The exact components and circuitry are implementation specific but may include devices such as transistors, processors, and memory. As those of ordinary skill will appreciate, the method and device described herein eliminates the need for wire bonds to connect the interconnects 30 to the components 46 and other circuitry. Thus, the manufacturing process is less complex and the assembly costs are reduced.

As illustrated in FIG. 2, each of the plurality of electrically conductive interconnects 30 extend through a separate interconnect hole 34 in the metallic substrate 24. As illustrated in FIG. 3, each of the interconnects 30 are attached to the metallic substrate 24. In particular, as will be explained in more detail below, the interconnects 30 are attached to an electrically insulating layer of the metallic substrate 24 by a solderable coating and a solder.

Figure 4A:
FIGS. 4A–4F are cross-sectional views of a metallic substrate illustrating one embodiment of a method of the present invention that forms an interconnect device through the metallic substrate.

FIGS. 4A–4F illustrate a suitable method for securing the electrically conductive interconnects 30 to the metallic substrate 24. FIG. 4A is a cross sectional view of a single sheet of metallic substrate 24. As mentioned above, the metallic substrate 24 has a first surface 36 and a second surface 38.

Figure 4B:
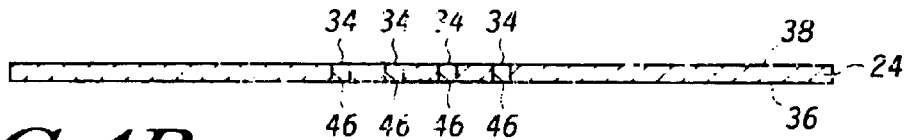

As shown in FIG. 4B, the method further includes forming a plurality of interconnect holes 34 in the metallic substrate 24. Each interconnect hole 34 is defined by an internal surface 46 of the metallic substrate 24 that extends from the first surface 36 to the second surface 38. The width of the interconnect holes 34 is slightly larger than the width of the interconnects 30 and the geometric shape of the interconnect holes 34 is preferably the same as the interconnects 30.

Figure 4C:
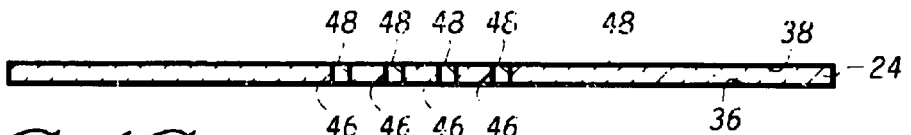

As shown in FIG. 4C, the method further includes applying an electrically insulating layer 48 to the metallic substrate 24 including at least the first surface 36, the second surface 38, and the internal surface 46. In one embodiment, where the metallic substrate 24 is made of aluminum, the insulating layer 48 is an oxidation layer formed through an anodization process. Anodization in this case then will provide the dielectric between the interconnects 30 and the metallic substrate 24.

Figure 4D:
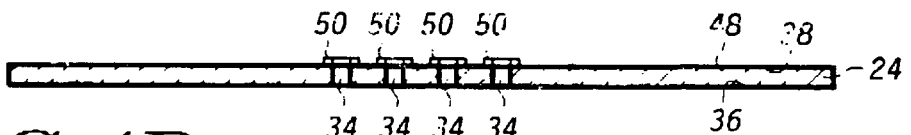

As shown in FIG. 4D, the method further includes applying, by firing or curing, a solderable coating 50 to at least a portion of the insulating layer 48 on the second surface 38 of the metallic substrate 24. The solderable coating 50 may be applied around each interconnect hole 34. The solderable coating 50 may also run inside each interconnect hole 34. This step is necessary when the insulating layer 48 is not practically solderable. For example, solder will not adhere to anodized aluminum. Therefore, a solderable coating 50 is applied to the metallic substrate 24.

A suitable solderable coating 50 is a high temperature processed glass filled ink, such as Ferro 3350 from Ferro Corporation, that is fired by being exposed to a temperature of approximately 600° C. for approximately 5 minutes. The high temperature processed glass is preferably one that contains one or more of silver and copper. This allows the solderable coating 50 to also serve as the electrically conductive traces that run between the interconnects 30 and the components 46. In another embodiment, the solderable coating 50 may be a low temperature processed organic material, such as Dynaloy 350 from Dynaloy, Inc., that is cured by being exposed to a temperature of approximately 150° C. for approximately 10 minutes. Applying a solderable coating 50 to a portion of the insulation layer 48 permits the securing of the interconnects 30 to the metallic substrate 24.

Figure 4E:
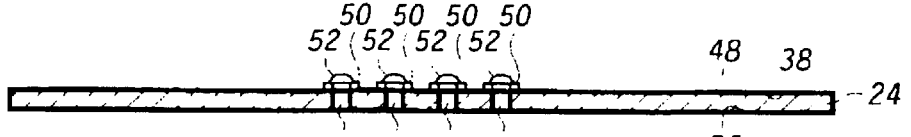

As shown in FIG. 4E, the method further includes applying a solder 52 to at least a portion of the solderable coating 50 at or above each interconnect hole 34. The solder 52 is used to bond the interconnects 30 to the metallic substrate 24 within the interconnect holes 34. The solder 52 may be a solder paste that is preferably screened onto the portion of the solderable coating 50.

Figure 4F:
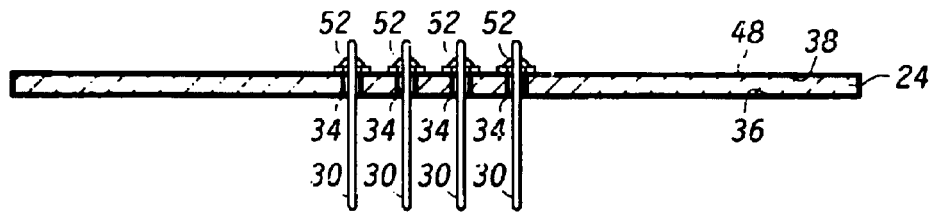

As shown in FIG. 4F, the method further includes inserting a interconnect 30 within each interconnect hole 34 so that the interconnect 30 comes in contact with the solder 52. In one embodiment, this is done by inserting the interconnects 30 from the first surface 36 of the metallic substrate 24. Thereafter, the interconnects 30 are solder bonded to the metallic substrate 24. This may be done by reflowing solder paste in a reflow oven.

The above steps may be done by a mechanical process or in connection with an automated pick-and-place machine. As seen in the process described in FIGS. 4A–4F, the use of wire bonds is eliminated which reduces the complexity of the assembly process. The electrically conductive traces of the circuitry running to the components 46 may be directly masked onto the insulated metallic substrate 24 and to the interconnects 30. Additionally, no special plating is required on the metallic substrate 24. Moreover, the process steps described above utilize conventional methods such that special equipment is not necessary.

Further, it is noted that the above described method may provide a hermetic seal at each of the interconnect holes 34 after the processing steps. The interconnect holes 34 are sealed by the solderable coating 50 and solder 52. This is of particular interest in automotive applications where the electronic control module 20 may need to be hermetically sealed. The benefit of the present invention is that it permits the use of small through holes in the metallic substrate 24. Thus, the overall area for leaks is severely reduced.

Figure 5A:
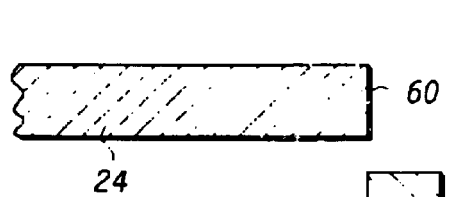
FIGS. 5A–C are cross-sectional views of a metallic substrate and housing illustrating one embodiment of a method of the present invention that attaches the metallic substrate to the housing.
Figure 5A:
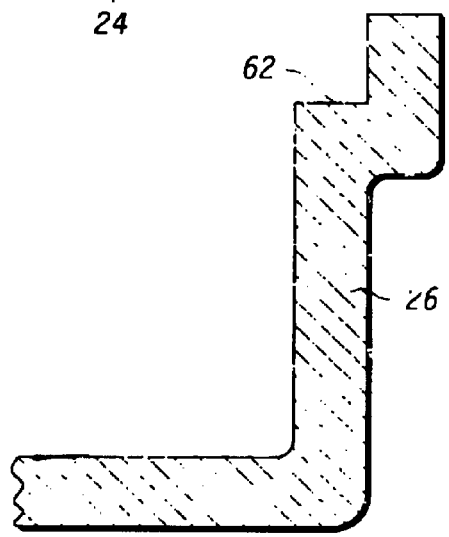
Figure 5B:
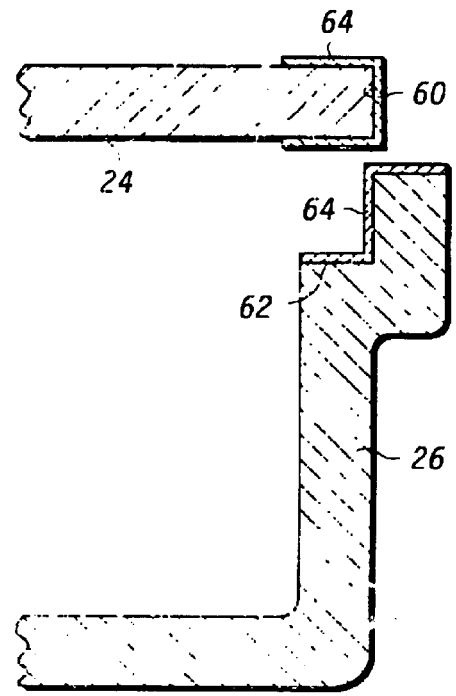
Figure 5C:
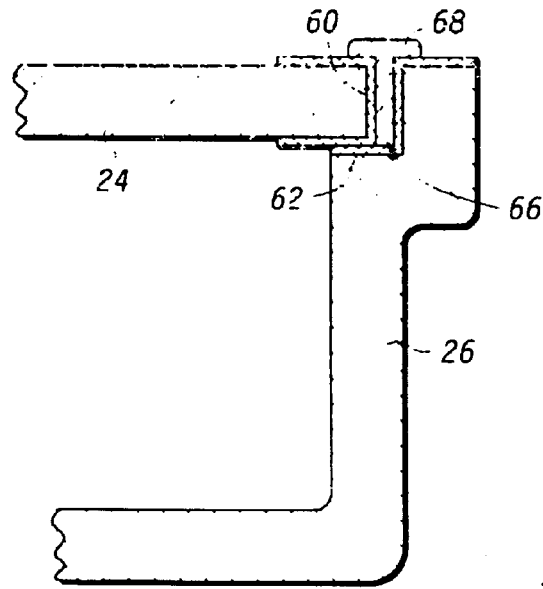

In cases where a hermetically sealed module is needed, FIGS. 5A–5C illustrate a method for securing the metallic substrate 24 to the module housing 26. In one embodiment, the metallic substrate 24 is a relatively flat piece of metal as shown in FIG. 5A. An outer edge 60 of the metallic substrate 24 is mated with a groove 62 formed in the module housing 26.

It is preferable to use soldering methods for attaching the metallic substrate 24 to the module housing 26. Soldering methods are cheaper than welding and other known methods. Solder, however, will not bond directly to thermally conductive metallic materials such as aluminum. Accordingly, a new way to permit soldering has been found to take advantage of lower cost assembly methods.

To permit soldering in this application, as shown in FIG. 5B, the method includes applying, by firing, a solderable coating 64 to at least a portion of the outer edge 60 of the metallic substrate 24 and to at least a portion of the groove 62 of the module housing 26. This step is necessary when the metallic pieces to be attached are not practically solderable.

A suitable solderable coating 64 is a high temperature processed glass filled ink, such as Ferro 3350 from Ferro Corporation, that is fired by being exposed to a temperature of approximately 600° C. for approximately 5 minutes. The high temperature processed glass is preferably one that contains one or more of silver and copper. Applying a solderable coating 64 to the portion of the outer edge 60 of the metallic substrate 24 and to the portion of the groove 62 of the module housing 26 permits the securing of the metallic substrate 24 to the module housing 26.

In one embodiment, the method may further include a step of applying an outer insulating layer (not shown) to the metallic substrate 24 and the module housing 26 prior to the step of applying, or firing, the solderable coating 64. Similar to the process described above, if the material used for the metallic substrate 24 and the module housing 26 is aluminum, the insulating layer may be an oxidation layer that formed through an anodization process.

As shown in FIG. 5C, the outer edge 60 of the metallic substrate 24 is joined with the groove 62 of the module housing 26 to form a joint 66. The method further includes applying a solder 68 at the joint 66 between a portion of the outer edge 60 of the metallic substrate 24 and a portion of the groove 62 of the module housing 26. The solder 68 is used to bond the metallic substrate 24 and the module housing 26. The solder 68 will also form a hermetic seal for the electronic control module 20. The solder 68 may be a solder paste that is preferably screened onto the portion of the solderable coating 64. Thereafter, the joint 66 may be solder bonded by reflowing solder paste of the solder 68 in a reflow oven.

What has been described is a method and apparatus for securing an electrically conductive interconnect through a metallic substrate. The present invention permits the use of less costly assembly methods that can be of particular interest in high volume production.

The above description of the present invention is intended to be exemplary only and is not intended to limit the scope of any patent issuing from this application. For example, the present discussion used an electronic control module to illustrate the method and apparatus of the present invention. The present invention is also applicable to other applications that use a metallic substrate and may further apply to electrically connecting circuits and components through multiple metallic substrates. The present invention is intended to be limited only by the scope and spirit of the following claims.

What is claimed is:

1. A method for securing an electrically conductive interconnect through a metallic substrate, the metallic substrate having a first surface and a second surface, the method comprising the steps of:

forming a hole in the metallic substrate, the hole defined by an internal surface of the metallic substrate that extends from the first surface to the second surface of the metallic substrate;

applying an electrically insulating layer to the metallic substrate including at least the first surface, the second surface, and the internal surface;

applying an electrically conductive solderable coating to at least a portion of the electrically insulating layer on the second surface of the metallic substrate around the hole;

applying a solder to at least a portion of the solderable coating and above the hole;

inserting the interconnect through the hole; and solder bonding the interconnect within the hole, wherein the solder completely covers the hole forming an hermetic seal.

2. The method of claim 1 wherein the metallic substrate is made of aluminum.

3. The method of claim 2 wherein the step of applying the electrically insulating layer to the metallic substrate includes anodizing the metallic substrate to form an oxidation layer to the metallic substrate.

4. The method of claim 1 wherein the step of applying the solderable coating to at least the portion of the electrically insulating layer includes firing a high temperature processed glass filled ink containing at least one of the group of silver and copper.

5. The method of claim 1 wherein the step of applying the solderable coating to at least the portion of the electrically insulating layer includes curing a low temperature processed organic material containing at least one of the group of silver and copper.

6. The method of claim 1 wherein the step of applying a solder to at least the portion of the solderable coating includes applying a solder paste.

7. The method of claim 1 wherein the step of inserting of interconnect through the hole includes inserting the interconnect from the first surface of the metallic substrate.

8. The method of claim 1 wherein the step of solder bonding the interconnect within the hole includes placing the interconnect such that it comes in contact with the solder applied above the hole; and reflowing the solder in a reflow oven.

9. A method for securing an electrically conductive interconnect through an aluminum substrate to be joined to a housing, the aluminum substrate having a first surface and a second surface, the method comprising the steps of:

forming a hole in the aluminum substrate, the hole defined by an internal surface of the aluminum substrate that extends from the first surface to the second surface of the aluminum substrate;

anodizing the aluminum substrate to form an electrically insulating layer on at least the first surface, the second surface, and the internal surface;

applying an electrically conductive solderable coating to at least a portion of the electrically insulating layer on the second surface of the aluminum substrate around the hole;

applying a solder to at least a portion of the solderable coating and above the hole;

inserting the interconnect through the hole; and solder bonding the interconnect within the hole, wherein the solder completely covers the hole forming an hermetic seal.

10. The method of claim 9 wherein the housing is made of aluminum, and the housing and substrate have respective mating surface, wherein the applying steps include applying the solderable coating to the mating surfaces of the housing and substrate, and applying solder paste to at least one of the mating surfaces of the housing and substrate, wherein the solder bonding step includes solder bonding the mating surfaces of the housing and substrate together to form an hermetic seal therebetween.

11. The method of claim 9 wherein the step of applying the solderable coating to at least the portion of the electrically insulating layer includes firing a high temperature processed glass filled ink containing at least one of the group of silver and copper.

12. The method of claim 9 wherein the step of applying the solderable coating to at least the portion of the electrically insulating layer includes curing a low temperature processed organic material containing at least one of the group of silver and copper.

13. The method of claim 10 wherein the step of anodizing includes anodizing the mating surfaces of the housing and substrate.

14. The method of claim 9 wherein the step of inserting the interconnect through the hole includes inserting the interconnect from the first surface of the metallic substrate.

15. The method of claim 9 wherein the step of solder bonding the interconnect within the hole includes placing the interconnect such that it comes in contact with the solder applied above the hole; and reflowing the solder in a reflow oven.

16. A method for securing an electrically conductive interconnect through an aluminum substrate to be joined to an aluminum housing at respective mating surfaces of the substrate and the housing, the aluminum substrate having a first surface and a second surface, the method comprising the steps of:

forming a hole in the aluminum substrate, the hole defined by an internal surface of the aluminum substrate that extends from the first surface to the second surface of the aluminum substrate;

applying an electrically insulating layer to the aluminum substrate including at least the first surface, the second surface, and the internal surface;

applying an electrically conductive solderable coating to at least a portion of the electrically insulating layer on the second surface of the aluminum substrate around the hole and to the mating surfaces of the housing and substrate;

applying a solder to at least a portion of the solderable coating and above the hole and to at least one of the surfaces of the housing and substrate;

inserting the interconnect through the hole;

placing the interconnect such that it comes in contact with the solder applied above the hole and abutting the mating surfaces of the substrate and housing; and reflowing the solder in a reflow oven, wherein the solder completely covers the hole and the mating surfaces to form an hermetic seal.

17. The method of claim 16 wherein the applying an electrically insulating layer step includes applying an electrically insulating layer to the mating surfaces of the substrate and housing.

18. The method of claim 17 wherein the step of applying the electrically insulating layer to the metallic substrate includes anodizing the metallic substrate to form an oxidation layer to the metallic substrate.

19. The method of claim 1 wherein the step of applying the solderable coating to at least the portion of the electrically insulating layer includes firing a high temperature processed glass filled ink containing at least one of the group of silver and copper.

20. The method or claim 1 wherein the step of applying the solderable coating to at least the portion of the electrically insulating layer includes curing a low temperature processed organic material containing at least one of the group of silver and copper.

21. The method of claim 1 wherein the step of applying a solder to at least the portion of the solderable coating includes applying a solder paste.

22. The method of claim 1 wherein the step of inserting the interconnect through the hole includes inserting the interconnect from the first surface of the metallic substrate.

23. The method of claim 1 wherein the step of solder bonding the interconnect within the hole includes placing the interconnect such that it comes in contact with the solder applied above the hole; and reflowing the solder in a reflow oven.

* * * * *

UNITED STATES PATENT AND TRADEMARK OFFICE
CERTIFICATE OF CORRECTION

PATENT NO. : 6,763,580 B2  
APPLICATION NO. : 10/103084  
DATED : July 20, 2004  
INVENTOR(S) : Rak et al.

It is certified that error appears in the above-identified patent and that said Letters Patent is hereby corrected as shown below:

Column 8, line 21, reads "of the surfaces", should read --of the mating surfaces--

Signed and Sealed this

Fourth Day of September, 2007

JON W. DUDAS  
*Director of the United States Patent and Trademark Office*